(12) United States Patent
Herner et al.

(10) Patent No.: US 6,541,401 B1
(45) Date of Patent: Apr. 1, 2003

(54) WAFER PRETREATMENT TO DECREASE RATE OF SILICON DIOXIDE DEPOSITION ON SILICON NITRIDE COMPARED TO SILICON SUBSTRATE

(75) Inventors: Scott Brad Herner, Palo Alto, CA (US); Manuel Anselmo Hernandez, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/629,040

(22) Filed: Jul. 31, 2000

(51) Int. Cl.[7] .................... H01L 21/31; H01L 21/469
(52) U.S. Cl. .............. 438/787; 438/424; 438/427; 438/433; 438/778
(58) Field of Search .................. 438/424, 427, 438/433, 692, 778, 787, 974, 761, 763, 782, 789, 790; 427/532, 534

(56) References Cited

U.S. PATENT DOCUMENTS

| | | | | |
|---|---|---|---|---|
| 5,605,867 A | * | 2/1997 | Sato et al. ............... | 438/790 |
| 5,665,635 A | * | 9/1997 | Kwon et al. ............. | 438/427 |
| 6,235,354 B1 | * | 5/2001 | Lee et al. ................ | 427/534 |

OTHER PUBLICATIONS

Suzuki et al, "A Fully Planarized Multilevel Interconnection Technology Using Selective TEOS–Ozone APCVD", IEDM 1992, 293–296.*

D.M. Dobkin et al., "Mechanisms of Deposition of $SiO_2$ from TEOS and Related Organosilicon Compounds and Ozone," *J. Electrochem. Soc.*, vol. 142, No. 7, pp. 2332–2340 (Jul. 1995).

V.Y. Vassiliev et al., "Growth Kinetics and Deposition–Related Properties of Subatmospheric Pressure Chemical Vapor Deposited Borophosphosilicate Glass Film," *Journal of the Electrochemical Society*, vol. 146, No. 8, pp. 3039–3051 (1999).

(List continued on next page.)

*Primary Examiner*—Matthew Smith
*Assistant Examiner*—Craig P. Lytle
(74) *Attorney, Agent, or Firm*—Townsend and Townsend and Crew

(57) ABSTRACT

A method of decreasing the growth rate of silicon dioxide films on a silicon nitride pad on a silicon wafer wherein the decrease in growth rate of the silicon dioxide results in a self-planarized film on the wafer is provided. Also provided is a method of pretreating said silicon wafer wherein said wafer is contacted with a chemical, such as hydrogen peroxide, isopropyl alcohol or acetone and air-dried prior to silicon dioxide deposition. Additionally, selective oxidation sub-atmospheric chemical vapor deposition (SELOX SACVD) uses an ozone-activated tetraethylorthosilicate process to deposit said silicon dioxide on said wafer.

27 Claims, 13 Drawing Sheets

OTHER PUBLICATIONS

M. Yoshimaru et al., "Effects of Substrate on the Growth Characteristics of Silicon Oxide Films Deposited by Atmospheric Chemical Vapor Deposition Using $Si(OC_2H_5)_4$ and $O_3$," *J. Electrochem. Soc.*, 145, 2847 (1998).

K. Kwok et al., "Surface Related Phenomena in Integrated PECVD/Ozone–TEOS SACVD Processes for Sub–half Micron Gap Fill: Electrostatic Effects," *J. Electrochem. Soc.*, 141, 2172 (1994).

T. Homma et al., "A Fully Planarized Multilevel Interconnection Technology Using Semi–selective Tetraethoxysilane–ozone Chemical Vapor Deposition at Atmospheric Pressure," *J. Electrochem. Soc.*, 140, 3591 (1993).

K. Tsukamoto et al., "Tetraethylorthosilicate Vapor Treatment for Eliminating Surface Sensitivity in Tetraethylortho silicate/$O_3$ Atmospheric–pressure Chemical Vapor Deposition, *Electrochem."* *Sol. St. Lett.*, 2, 24 (1999).

T. Nakano et al., "A Model of Effects of Surface Pretreatment by Organic Solvents on Ozone–tetraethosysilane Chemical Vapor Deposition," *J. Electrochem. Soc.*, 142, 641 (1995).

N. Elbel et al., "A New STI Process Based on Selective Oxide Deposition," *1998 Symposium on VLSI Digest of Technical Papers*, pp. 208–209 (1998).

J. Schlueter, "Trench Warfare: CMP and Shallow Trench Isolation," *Semiconductor International*, pp. 123–130 (Oct. 1999).

\* cited by examiner

Deposition Time: t
Ox growth in trench: 100 nm
Ox growth on SiN: negligible

Deposition Time: 2t
Ox growth in trench: 200 nm
Ox growth on SiN: negligible

Deposition Time: 4t
Ox growth in trench: 400 nm
Ox growth on SiN: 150 nm

Deposition Time: 8t
Ox growth in trench: 850 nm
Ox growth on SiN: 450 nm

WAFER PRETREATMENT TO DECREASE RATE OF SILICON DIOXIDE DEPOSITION ON SILICON NITRIDE COMPARED TO SILICON SUBSTRATE

BACKGROUND OF THE INVENTION

1. Field of the Invention

The present invention generally relates to the fields of chemical vapor deposition of silicon dioxide on wafers to be used in integrated circuit technologies. More particularly, the present invention provides a method of pretreating a silicon wafer to decrease the deposition rate of a silicon dioxide film on the silicon nitride pad of the wafer.

2. Description of the Related Art

Traditionally, local oxidation of silicon (LOCOS) structures was the standard in isolation technology for integrated circuit (IC) silicon devices. However, inherent in this technology are problems of lateral expansion of the isolation region in proportion to depth, non-planarity, thinning, and generation of stress induced silicon defects. Non-planarity of surfaces particularly causes depth of focus problems during any subsequent lithographic patterning of the silicon layer. This becomes critical at design geometries of less than 0.35 microns.

Shallow trench isolation (STI) technology represents a superior application of device-level processing over the more standard LOCOS structure. Shallow trench isolation is primarily designed into devices at or below 0.25 microns with selective use occurring at 0.35 microns. Shallow trench isolation provides better trench depth, width control and greater packing density. Isolation areas are defined using photolithography and etch techniques; silicon dioxide (oxide) deposition into the silicon trench is accomplished via tetraethylorthosilicate (TEOS) or high-density plasma (HDP) vapor deposition.

However, shallow trench. isolation structures require a chemical mechanical polishing (CMP) of the oxide overburden o n the wafer after trench fill. Inherent in this procedure. are problems such as excessive trench oxide dishing in the large open areas which requires the use of dummy features or stop layers as preventative measures. More commonly, inverse masking and etching after silicon dioxide deposition is used to decrease the silicon dioxide thickness on active areas. When CMP is performed subsequent to inverse masking and etching, dishing is reduced compared to a process without inverse masking and etching. However, inverse masking and etching adds cost and complexity to the fabrication process. Failure to detect the CMP endpoint or failure to identify when the active area oxide is completely removed without excessive over-polishing reduces device yield. This increases both process complexity and cost.

Shallow trench isolation (STI) using selective oxide deposition (SELOX) utilizes the differential deposition rates on pad nitride and silicon to achieve good global planarity after the trench fill process. Self-planarizing trench fill occurs when specific conditions are set during chemical vapor deposition (CVD). Unlike standard shallow trench isolation processes, the self-planarization of the silicon dioxide film can reduce or eliminate the need for dummy features or inverse masking or etching. Thus the SELOX process is markedly less complex than traditional shallow trench isolation methods thereby reducing costs and improving manufacturability of devices.

By delaying deposition of silicon nitride until after deposition on silicon has begun, a thinner film is deposited on silicon nitride relative to silicon. When a delayed nucleation on silicon nitride effectively yields a selective deposition on silicon versus silicon nitride, the selectivity, or film thickness multiple, changes with the desired silicon dioxide thickness. Furthermore, the density of silicon dioxide on silicon nitride deposited by this method is low (porous), making non-destructive measurements of silicon dioxide on silicon nitride impossible. The selective deposition process can be improved upon by making deposition on silicon nitride slower relative to silicon, instead of delaying deposition, which can improve the film thickness multiple. Pretreatment of the wafer results in a constant selectivity value even with a change in film thickness and a concomitant improvement of the quality of the silicon dioxide film on silicon nitride.

The prior art is deficient in the lack of an effective method of decreasing the deposition rate of silicon dioxide on a silicon nitride pad on a wafer to yield a self-planarized oxide layer by pretreating the wafer. The present invention fulfills this long-standing need and desire in the art.

SUMMARY OF THE INVENTION

In one embodiment, the present invention provides a method of decreasing a deposition rate of a silicon dioxide film on a silicon nitride pad on a wafer comprising the steps of pretreating the wafer; and vapor-depositing a silicon dioxide film on the wafer; wherein a decreased silicon dioxide deposition rate on the silicon nitride substrate results in a self-planarizing silicon dioxide trench fill on the wafer.

In another embodiment, the present invention provides a method of pretreating a wafer prior to depositing a silicon dioxide film on the wafer comprising the steps of contacting the wafer with a chemical compound selected from the group consisting of hydrogen peroxide, isopropyl alcohol and acetone; and air-drying said chemical compound onto the wafer; wherein the pretreatment of the wafer decreases a deposition rate of a silicon dioxide film on a silicon nitride pad on the wafer.

In yet another embodiment, the present invention provides a method of decreasing the deposition rate of a silicon dioxide film on a silicon nitride pad on a shallow trench isolation silicon wafer comprising the steps of: contacting the wafer with a 30% hydrogen peroxide solution in water; air-drying the hydrogen peroxide solution onto the wafer; and vapor depositing the silicon dioxide on the wafer using ozone-activated tetraethylorthosilicate ($O_3$/TEOS) wherein the vapor deposition is a selective oxidation subatmospheric chemical vapor deposition process (SELOX SACVD) and the decreased silicon dioxide deposition rate on the silicon nitride pad results in self-planarizing silicon dioxide trench fill on the wafer.

Other and further aspects, features, and advantages of the present invention will be apparent from the following description of the presently preferred embodiments of the invention given for the purpose of disclosure.

BRIEF DESCRIPTION OF THE DRAWINGS

So that the matter in which the above-recited features, advantage and objects of the invention, as well as others which will become clear, are attained and can be understood in detail, more particular descriptions of the invention briefly summarized above may be had by reference to certain embodiments thereof which are illustrated in the appended drawings. These drawings form a part of the specification. It is to be noted, however, that the appended drawings illustrate preferred embodiments of the invention and therefore are not to be considered limiting in their scope.

DETAILED DESCRIPTION OF THE INVENTION

Figure 1A:
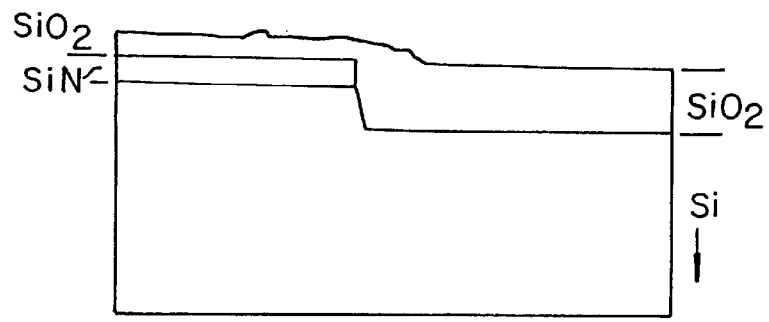
FIG. 1 shows scanning electron micrograph cross-sections of the selective oxide deposition using a 391 second deposition time on a patterned wafer without pretreatment (FIG. 1A) with an oxide thickness of 2420 Å on SiN and 6290 Å on Si, with H2O2 pretreatment (FIG. 1B) with an oxide thickness of 290 Å on SiN and 4260 Å on Si and with isopropanol alcohol (IPA) pretreatment (FIG. 1C) with an oxide thickness of 970 Å on SiN and 5900 Å on Si.

In one embodiment of the invention there is provided a method of decreasing a deposition rate of a silicon dioxide film on a silicon nitride pad on a wafer comprising the steps of pretreating the wafer and vapor-depositing a silicon dioxide film on the wafer. In this embodiment, the decreased silicon dioxide deposition rate on the silicon nitride substrate results in a self-planarizing silicon dioxide trench fill on the wafer wherein selectivity remains constant with a change in film thickness. The wafers employed may be, for example, shallow trench isolation devices comprising a silicon substrate and a silicon nitride pad. In this embodiment, the pretreating step may comprise the steps of contacting the wafer with a chemical compound and air-drying the chemical compound on the wafer. Representative examples of chemical compounds which can be used to air dry the wafer include hydrogen peroxide, isopropyl alcohol and acetone. Additionally, the hydrogen peroxide may comprise a 30% solution in water.

In one aspect of this embodiment of the present invention the silicon dioxide film is deposited on the wafer by a selective oxidation sub-atmospheric chemical vapor deposition (SELOX SACVD) process. A representative example of the SELOX SACVD process uses an ozone activated tetraethylorthosilicate (O3/TEOS) process to deposit the silicon dioxide on the wafer. The temperature selected during the selective oxidation sub-atmospheric chemical vapor deposition of silicon dioxide on the wafer may be, for example, about 400° C.

In another embodiment of the invention there is provided a method of pretreating a wafer prior to depositing a silicon dioxide film on the wafer. This method comprises the steps of contacting the wafer with a chemical compound and air-drying the chemical compound onto the wafer. The pretreatment of the wafer decreases the deposition rate of a silicon dioxide film on a silicon nitride pad on the wafer and the selectivity remains constant with a change in film thickness. Representative examples of chemical compounds which are useful in air drying the wafer in this method include hydrogen peroxide, isopropyl alcohol and acetone. Additionally, the hydrogen peroxide may comprise a 30% solution in water. The wafers employed may be, for example, shallow trench isolation devices comprising a silicon substrate and a silicon nitride pad.

In an aspect of this embodiment the silicon dioxide film is deposited on the wafer by a selective oxidation sub-atmospheric chemical vapor deposition (SELOX SACVD) process. A representative example of the SELOX SACVD process uses an ozone activated tetraethylorthosilicate (O3/TEOS) process to deposit the silicon dioxide on the wafer. A useful temperature selected during the selective oxidation sub-atmospheric chemical vapor deposition of silicon dioxide on the wafer may be, for example, about 400° C.

In yet another embodiment of the invention there is provided a method of decreasing a deposition rate of a silicon dioxide film on a silicon nitride pad on a shallow trench isolation silicon wafer. This method comprises the steps of contacting the wafer with a 30% hydrogen peroxide solution in water; air-drying the hydrogen peroxide solution onto the wafer; and vapor depositing the silicon dioxide on the wafer using ozone activated tetraethylorthosilicate ($O_3$/TEOS) wherein the vapor deposition is a selective oxidation sub-atmospheric chemical vapor deposition process (SELOX SACVD). The decreased silicon dioxide deposition rate on the silicon nitride pad results in a self-planarizing silicon dioxide trench fill on the wafer such that selectivity remains constant with a change in film thickness. A useful temperature employed during the selective oxidation sub-atmospheric chemical vapor deposition of silicon dioxide on the wafer may be, for example, about 400° C.

The following examples are given for the purpose of illustrating various embodiments of the invention and are not meant to limit the present invention in any fashion.

EXAMPLE 1

Materials

SACVD™ selective oxide deposition of silicon oxide for shallow trench isolation was carried out using AMAT Giga-Fill SACVD™ USG equipment.

EXAMPLE 2

Pretreatment of Wafers

Oxide deposition resulting in film thickness on silicon (Si) being 2–3× that on silicon nitride (SiN) still requires subsequent planarization steps prior to chemical-mechanical polishing (CMP). Pretreatment allows for a much higher selectivity which improves the overall process. A sufficient film thickness multiple or selectivity, which is defined as $SiO_2$ thickness on Si/$SiO_2$ thickness on SiN, varies based on, among other considerations, the trench geometry, SiN thickness, CMP procedure. The ability to increase the multiple removes the need for subsequent planarization steps and decreases the time required for CMP resulting in an increased wafer throughput. It also improves the quality of the silicon dioxide film on silicon nitride; i.e., the resultant film is denser than without pretreatment. The improved quality of the film allows for nondestructive means; such as ellipsometry, of measuring its thickness allowing for a more accurate end point of the CMP process, thereby making the overall module more robust.

Additionally, the selective deposition process is carried out at lower temperatures thus increasing the deposition rate and therefore throughput. The deposition rate of the selective process is 90 nm/min on silicon at 430° C. versus 140 n n/min on silicon at 400° C. With pretreatment, the best known method is at 400° C. versus 430° C. for the untreated standard selective process. Without pretreatment, the elevated deposition temperature prevents the porous silicon dioxide film on silicon nitride from encroaching into the trench areas at the silicon "corner" region.

The selectivity or film thickness multiple becomes independent of silicon dioxide thickness with the pretreatment method. With pretreatment, the deposition rate of silicon dioxide on silicon nitride is no longer delayed; however, the deposition rate on silicon nitride is much reduced relative to silicon while not affecting the deposition rate on silicon. This allows for a more predictable process when going to smaller, more aggressive trench geometries.

Absent pretreatment of wafers prior to oxide deposition, a film thickness multiple of 1.7 to 2.9× has been achieved on various wafers for 5000–6000 Å oxide film thickness. Silicon dioxide film thickness on silicon is measured in large open areas; i.e., areas that have had silicon etched without an active area nearby. Silicon dioxide film thickness on silicon nitride is measured in larger active areas; i.e., areas that do not have etched areas nearby and have the silicon nitride pad intact.

Figure 1B:
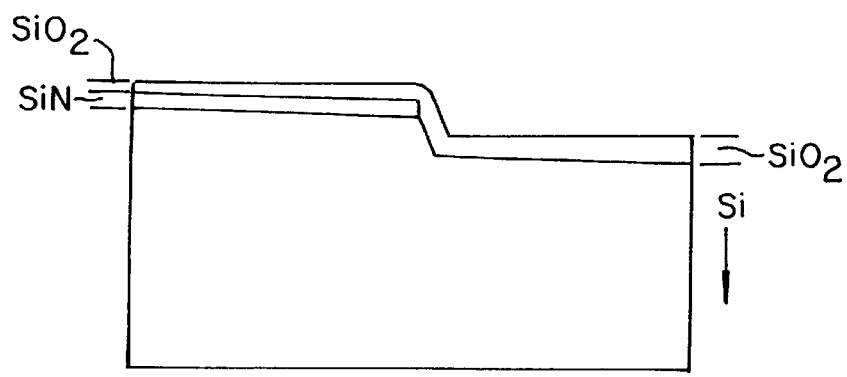
Figure 1C:
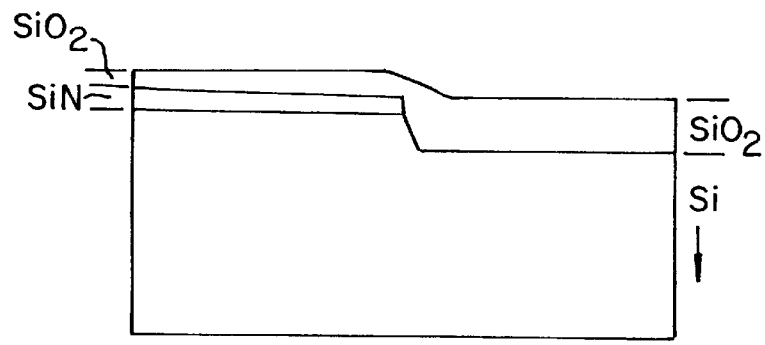

Dipping the wafers in either $H_2O_2$ (hydrogen peroxide 30% concentration, diluted in $H_2O$), isopropyl alcohol (IPA), or acetone, and air drying prior to entry into the oxide deposition chamber, increased the film thickness multiple. FIGS. 1A and 1B show scanning electron micrograph (SEM) cross-sections of patterned wafers deposited by the same $O_3$/TEOS process. Oxide deposition on a patterned wafer without pretreatment yields a film thickness multiple of 2.6×. With $H_2O_2$ pretreatment, the multiple increases to 14.7×. Filling of the trench with oxide is not affected by the $H_2O_2$ pretreatment. While the oxide deposition rate has decreased somewhat on Si with $H_2O_2$ pretreatment, it is significantly decreased on SiN. With an IPA-pretreatment, the multiple is 6.1× (FIG. 1C). Oxide film thickness with acetone-pretreatment of flat wafers is similar to the deposition thickness and film morphology of patterned wafers with IPA-pretreatment (data not shown).

EXAMPLE 3

Surface Morphology of Films

Figure 2A:
FIG. 2 shows scanning electron micrograph cross-sections of the surface morphology of $SiO_2$ on untreated SiN film (FIG. 2A), on H2O2-pretreated SiN film (FIG. 2B) and on either IPA- or acetone-pretreated SiN (FIG. 2C).
Figure 2B:
Figure 2C:
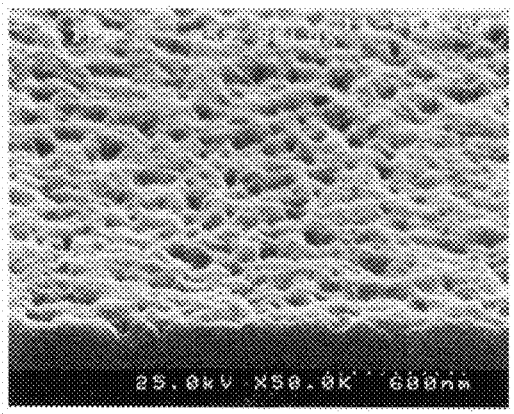

The morphology of the $SiO_2$ film grown on SiN with $H_2O_2$-pretreatment is different than on untreated SiN. Oxide films on $H_2O_2$-pretreated SiN are smoother; i.e., they do not have any pores (FIGS. 2A and 2B). This yields a second advantage to $H_2O_2$-pretreatment in that the oxide film thickness can be measured with an ellipsometer, while the poor quality film on untreated SiN can only be measured with scanning electron microscopy (SEM) on a fractured wafer, which is destructive. Oxide film thickness measurement on SiN is crucial to determine the time for chemical mechanical polishing in the subsequent step. Pretreatment by either IPA or acetone, while increasing the selectivity over untreated wafers, did not achieve the high selectivity of $H_2O_2$-pretreatment. The film quality also improved with either IPA or acetone pretreatment, but again not to the degree $H_2O_2$-pretreatment improved subsequent oxide film quality (FIG. 2C). Therefore, pretreatment by $H_2O_2$ represents the best known method for enhancing selectivity with the current oxide deposition process.

EXAMPLE 4

Selective Growth Rates of Oxide on Silicon vs. Silicon Nitride

Selective oxide deposition for shallow trench isolation (STI) provides a tunable selectivity between the oxide growth rate on silicon and the oxide growth rate on silicon nitride to achieve a self-planarizing oxide growth.

Selectivity=film thickness on silicon film thickness on nitride where the film thickness on silicon is greater than the film thickness on silicon nitride.

Figure 3:
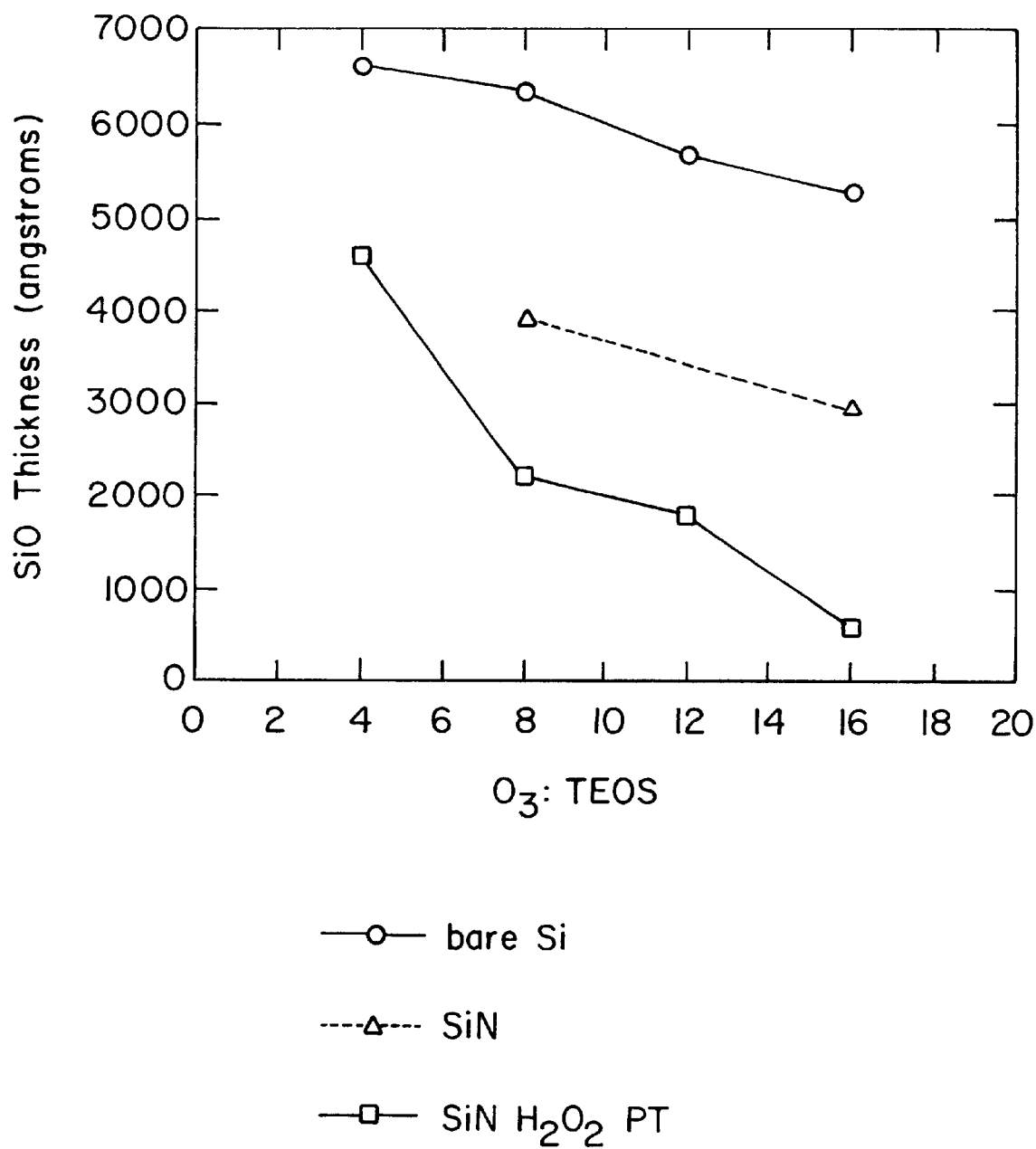
FIG. 3 depicts the oxide film thickness on bare silicon, silicon nitride and H2O2-pretreated silicon nitride substrates with different O3:TEOS flow ratios. Flow ratios are changed by changing the wt % O3 flow. Deposition time was 352 seconds for each wafer.
Figure 4A:
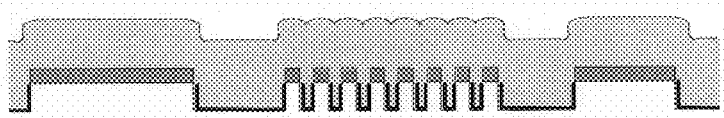
FIG. 4 compares diagrammatic and scanning electron micrographs of shallow trench isolation deposition techniques for traditional sub-atmospheric chemical vapor oxide deposition (SACVD), atmospheric pressure chemical vapor oxide deposition (APCVD) and low pressure chemical vapor oxide deposition (LPCVD) (FIG. 4A); high density plasma chemical vapor oxide deposition (HDPCVD) (FIG. 4B); and sub-atmospheric chemical vapor selective oxide deposition (SELOX SACVD) (FIG. 4C). Selective oxide deposition enables easy chemical mechanical polishing (CMP) integration as it is not necessary to use dummy features or inverse masking.
Figure 4A:
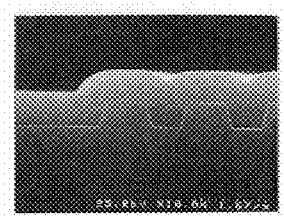
Figure 4B:
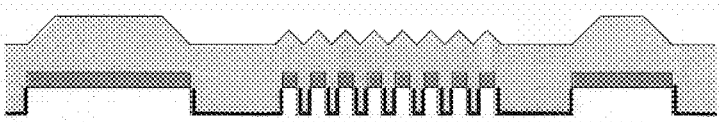
Figure 4B:
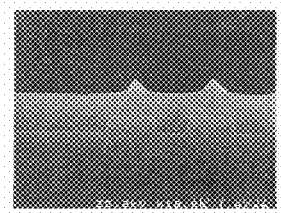
Figure 4C:
Figure 4C:
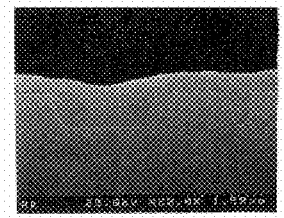

In general, increasing the $O_3$:TEOS ratio enhances the selective growth rate of oxide on silicon versus silicon nitride. FIG. 3 shows the change in film thickness on silicon nitride and silicon (flat) wafers with different $O_3$:TEOS ratios. Decreased film thicknesses are observed over the range of $O_3$:TEOS flow ratios examined, although the difference decreased with decreasing ratios.

Figure 5:
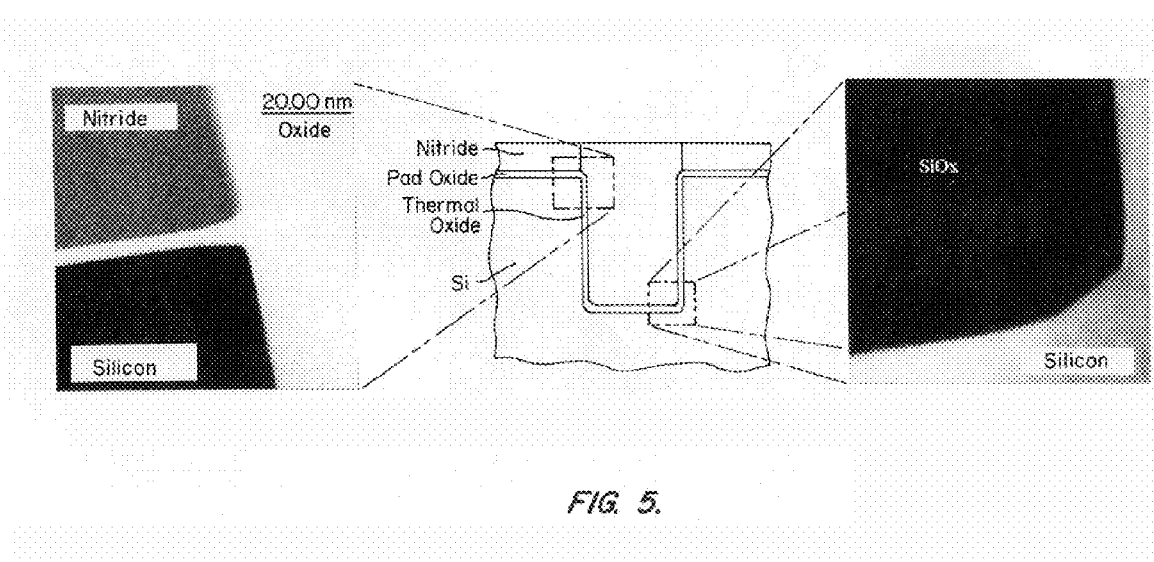
FIG. 5 depicts a cross-sectional view of a wafer after SACVD selective oxidation for trench fill including thermal electron micrographs (TEM) of the corners of the wafer.

Additionally, after selective deposition of CVD silicon dioxide, thus preserving selectivity, corner rounding is achieved by high temperature oxygen deposition that grows a thermal oxide. The SELOX process can attain the same good corner rounding as other vapor deposition processes such as high density plasma (HDP) vapor deposition. The post trench fill oxidation, after a 150 Å thermal oxide grown after a 1050° C., 45 minute anneal in $O_2$, shows good corner rounding with a homogeneous covering of oxide and no negative effect on the silicon wafer (FIG. 5).

EXAMPLE 5

Delayed Nucleation Effect of Oxide on Nitride Pad Layer with Standard (no pretreatment) SELOX Process vs. Decreased Deposition Rate with Pretreatment Prior to SELOX Process The selectivity of the standard SACVD $O_3$/TEOS film deposition is utilized to achieve self-planarization of the oxide layer as it is deposited on the wafer. In an optimized SACVD process selectivity is due to delayed nucleation of silicon dioxide on the silicon nitride pad as compared to the more immediate nucleation of silicon dioxide on the silicon in the trench. Once nucleation on nitride is initiated, however, the rate of oxide deposition is similar to that of oxide deposition on silicon in the trench when measuring film thickness. In fact, as the silicon dioxide deposited on silicon nitride is porous as compared to that on silicon, it effectively appears that the deposition rate on silicon nitride is reduced; i.e., not as many silicon dioxide molecules are deposited on silicon nitride as on silicon even though the film thickness on each are similar.

Figure 6:
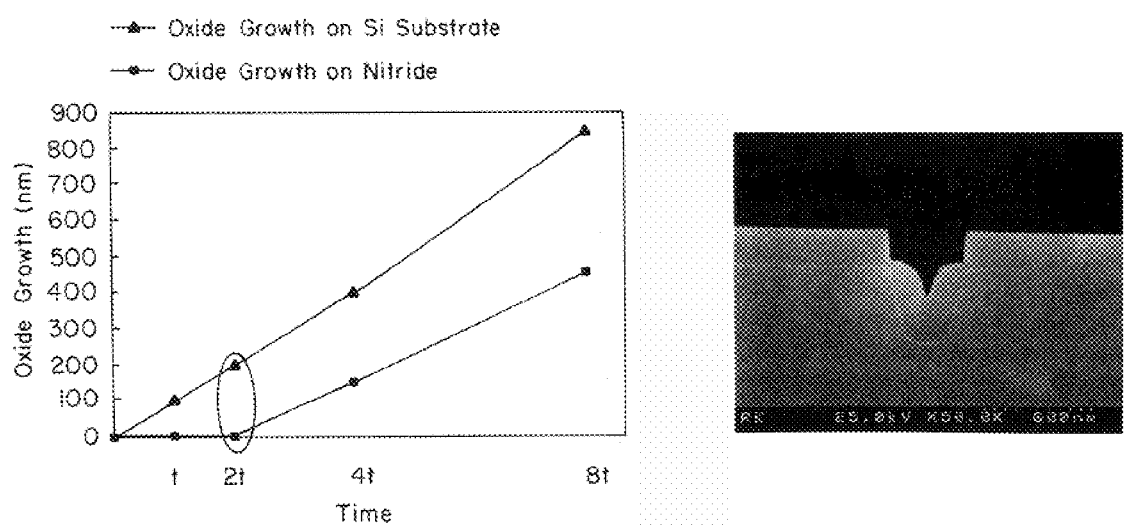
FIG. 6 compares oxide deposition on silicon nitride and silicon as a function of time.
Figure 7A:
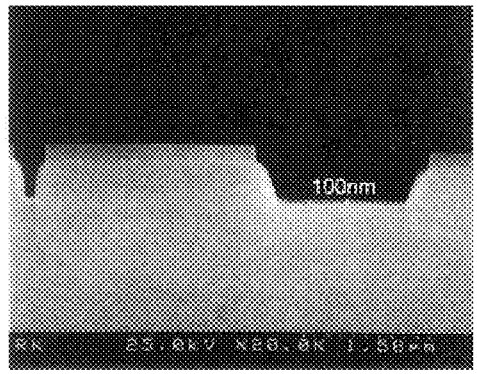
FIG. 7 shows scanning electron micrographs depicting the delayed nucleation effect of oxide on a silicon nitride pad layer as compared to the oxide growth on silicon in the trench of the wafer. At time t, oxide growth in trench is 100 n m and oxide growth on SiN is negligible (FIG. 7A); at time 2t, oxide growth in trench is 200 n m and oxide growth on SiN is negligible (FIG. 7B); at time 4t, oxide growth in trench is 400 n m and oxide growth on SiN is 150 nm (FIG. 7C); and at time 8t, oxide growth in trench is 850 n m and oxide growth on SiN is 450 n m (FIG. 7D).
Figure 7B:
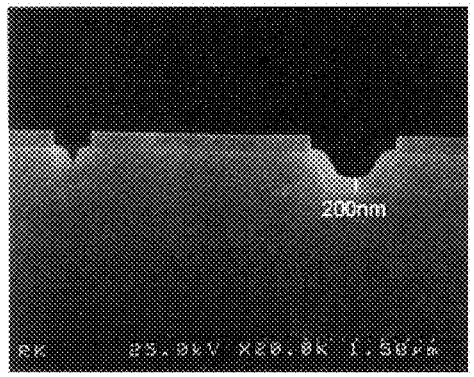
Figure 7C:
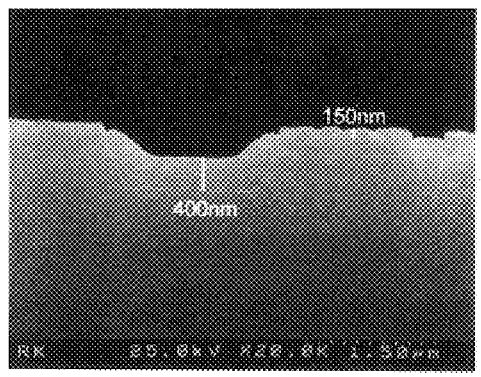
Figure 7D:
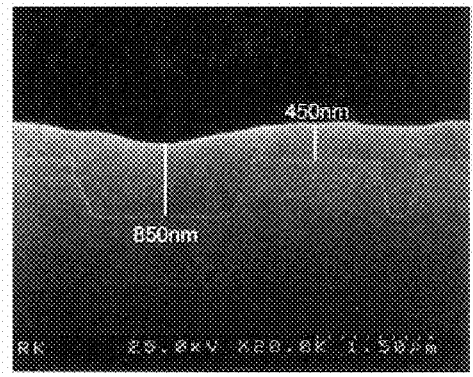

The graph in FIG. 6 indicates that, although oxide deposition onto the silicon in the trench of the wafer occurs immediately, oxide growth on the silicon nitride pad does not occur until a deposition time of 2t. This delayed nucleation effect coupled with the slightly faster rate of oxide deposition on silicon results in a self-planarized silicon dioxide layer on the wafer by a time of 8t. The scanning electron micrographs in FIG. 7 demonstrate that no significant oxide deposition on silicon nitride is even visible until a deposition time of 4t (FIG. 7C).

With pretreatment of the wafers, delayed nucleation of silicon dioxide on silicon nitride no longer occurs. While the deposition rate on silicon is unchanged, the deposition rate on silicon nitride is markedly reduced. Advantageously, pretreatment of the wafer results in an unchanged selectivity no matter what silicon dioxide thickness is deposited whereas, absent pretreatment, the selectivity value changes with silicon dioxide film thickness during the standard SELOX SACVD process.

EXAMPLE 6

SACVD O3/TEOS Film Characteristics

Figure 8:
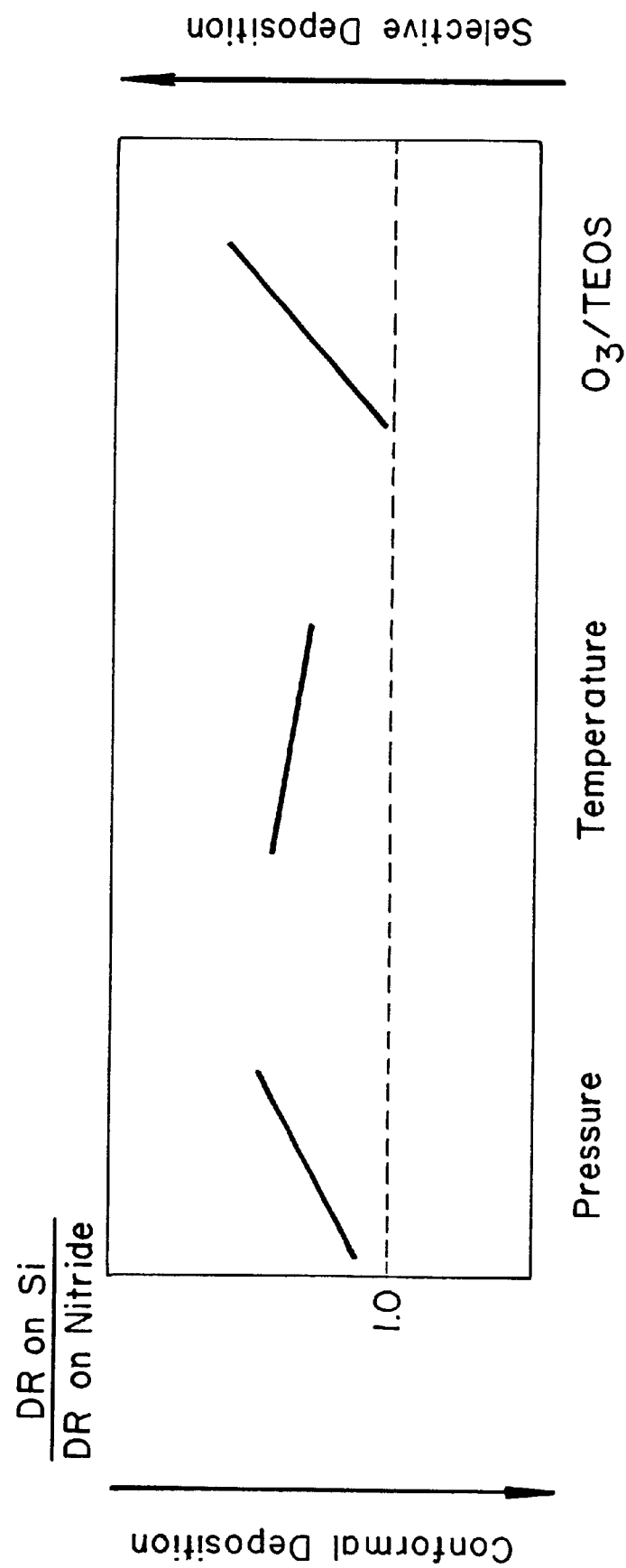
FIG. 8 depicts the optimization of pressure, temperature and O3/TEOS ratio for specific selectivities for conformal and selective SACVD deposition of oxide films.

An ozone-activated TEOS deposition of silicon dioxide films on the silicon nitride/silicon wafer is used to achieve self-planarization prior to chemical mechanical polishing of the wafer. In a selective oxide deposition process the initial step height of the trench is compensated for by choosing a selectivity value and determining the deposition time required for a globally planar oxide surface on the wafer. Pressure, temperature and $O_3$/TEOS ratio are optimized for either conformal SACVD USG oxide deposition for selectivity values of approximately 1 or selective SACVD USG deposition for selectivity values greater than 1 (FIG. 8).

Figure 9A:
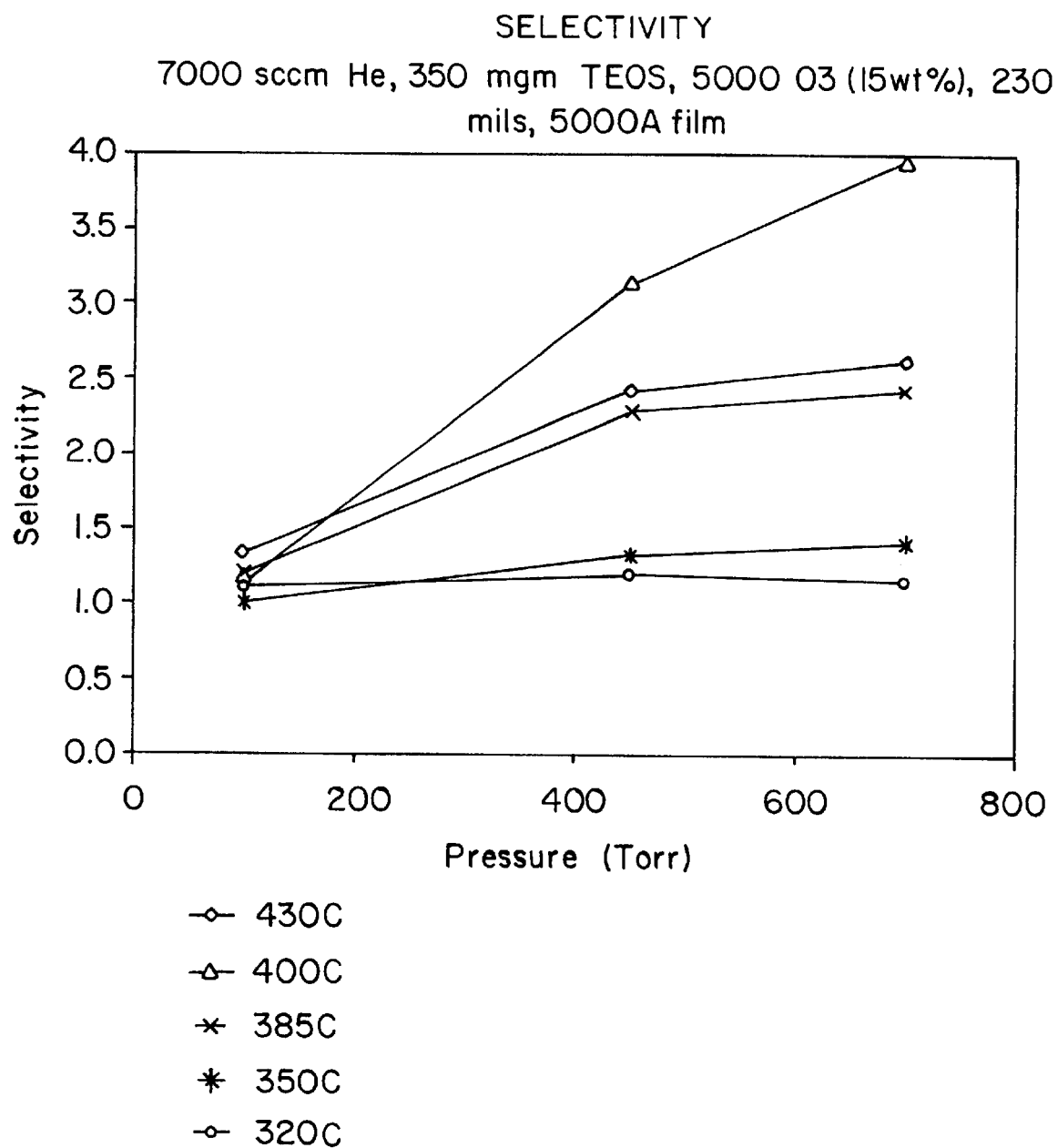
FIG. 9 illustrates characteristics of the SELOX process as performed using SACVD as a function of pressure and temperature. Selectivity: process conditions of 7000 sccm He, 350 mgm TEOS, 5000 $O_3$ (15 wt %), 230 mils, 5000 Å film (FIG. 9A); Deposition Rate: process conditions of 7000 sccm He, 350 mgm TEOS, 5000 $O_3$ (15 wt %), 230 mils, 5000 Å film (FIG. 9B); Wet Etch Rate Ratio (WERR) process conditions of 7000 sccm He, 350 mgm TEOS, 5000 $O_3$ (15 wt %), 230 mils, 5000 Å film (FIG. 9C); Shrinkage: process conditions of 7000 sccm He, 350 mgm TEOS, 5000 $O_3$ (15 wt %), 230 mils, 1000C anneal, 30 min., $N_2$ (FIG. 9D); Clean Time: process conditions of 7000 sccm He, 350 mgm TEOS, 5000 $O_3$ (15 wt %), 230 mils, 5000 Å film, throttle valve endpoint (no overetch) (FIG. 9E).
Figure 9B:
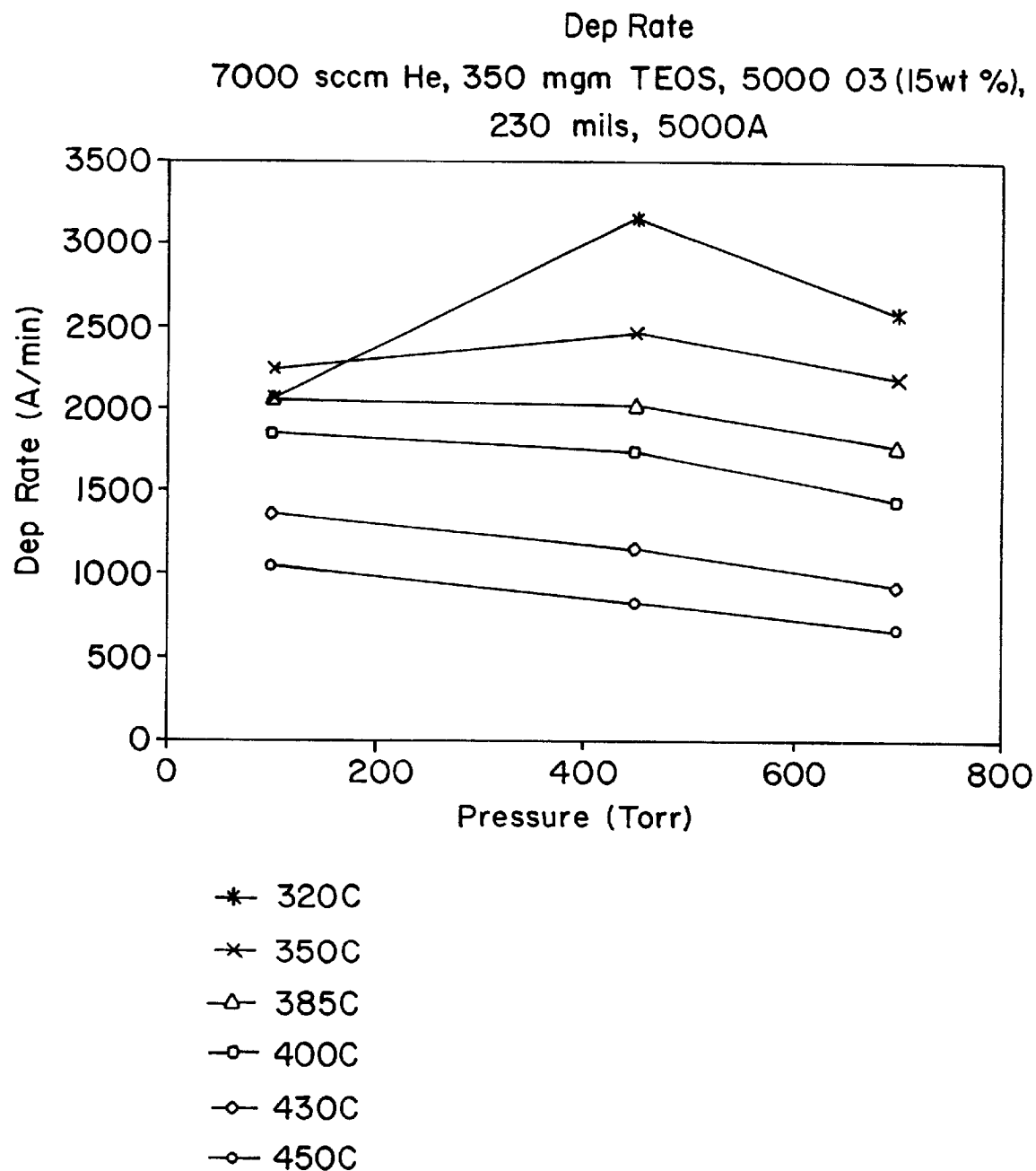
Figure 9C:
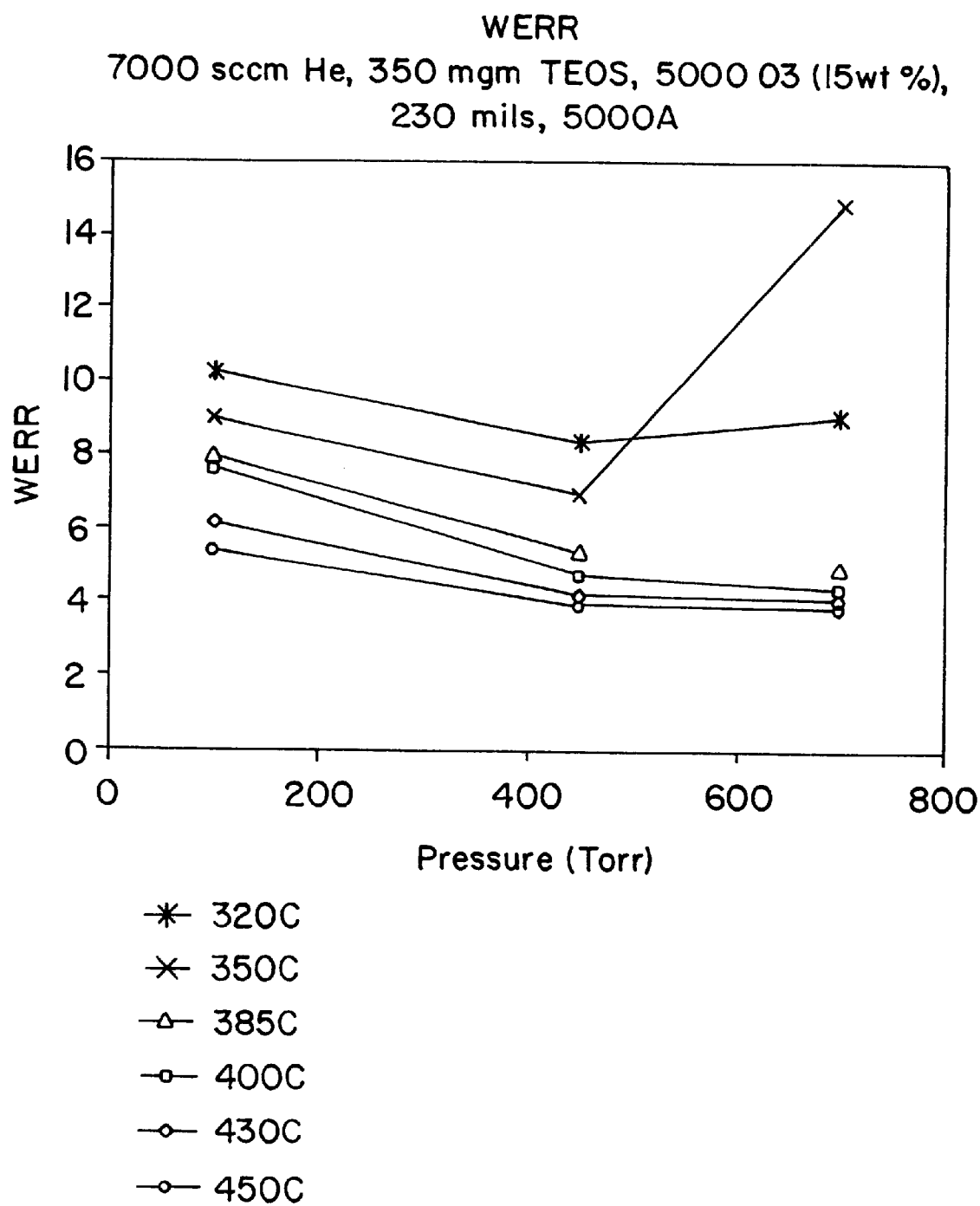
Figure 9D:
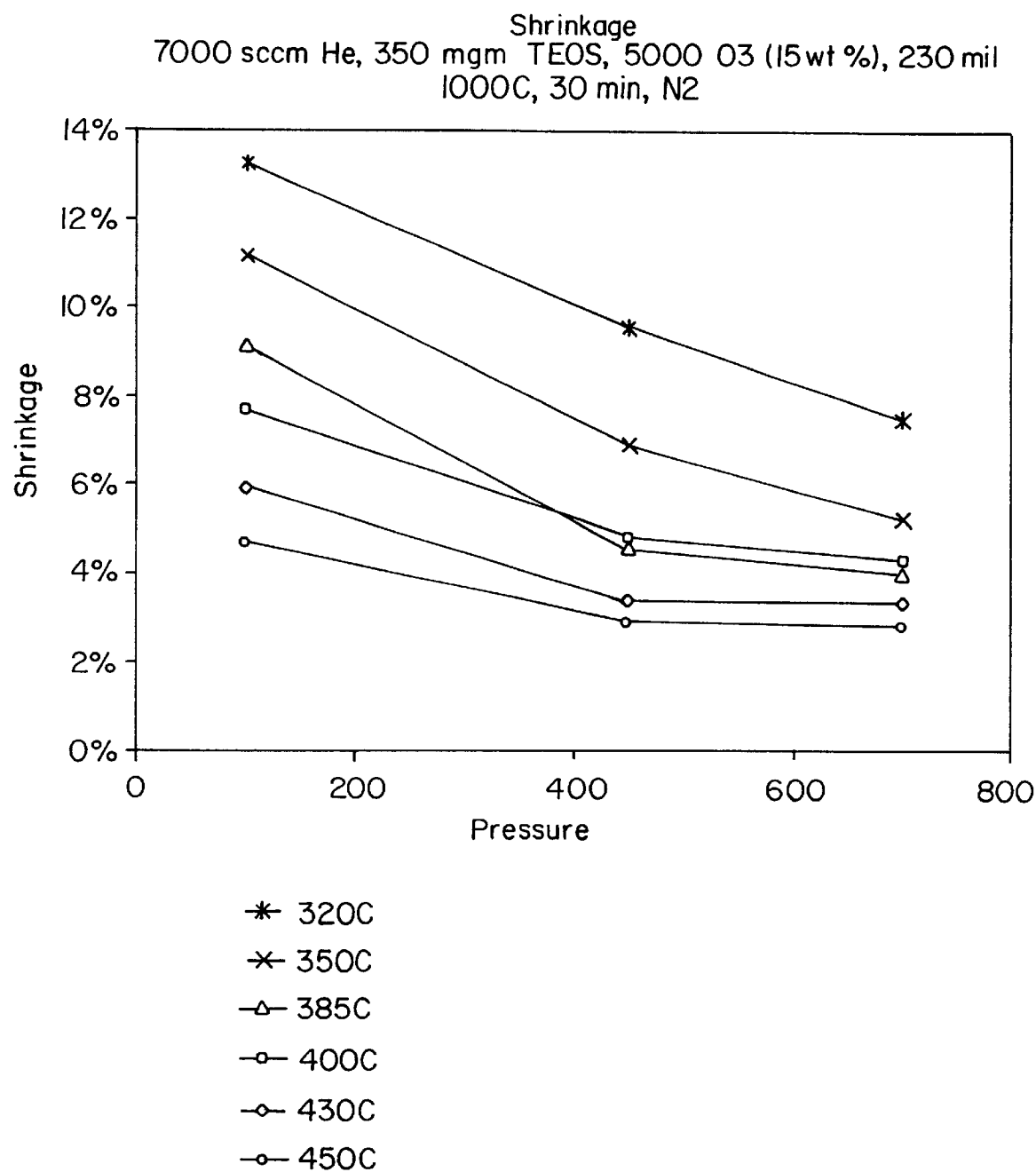
Figure 9E:
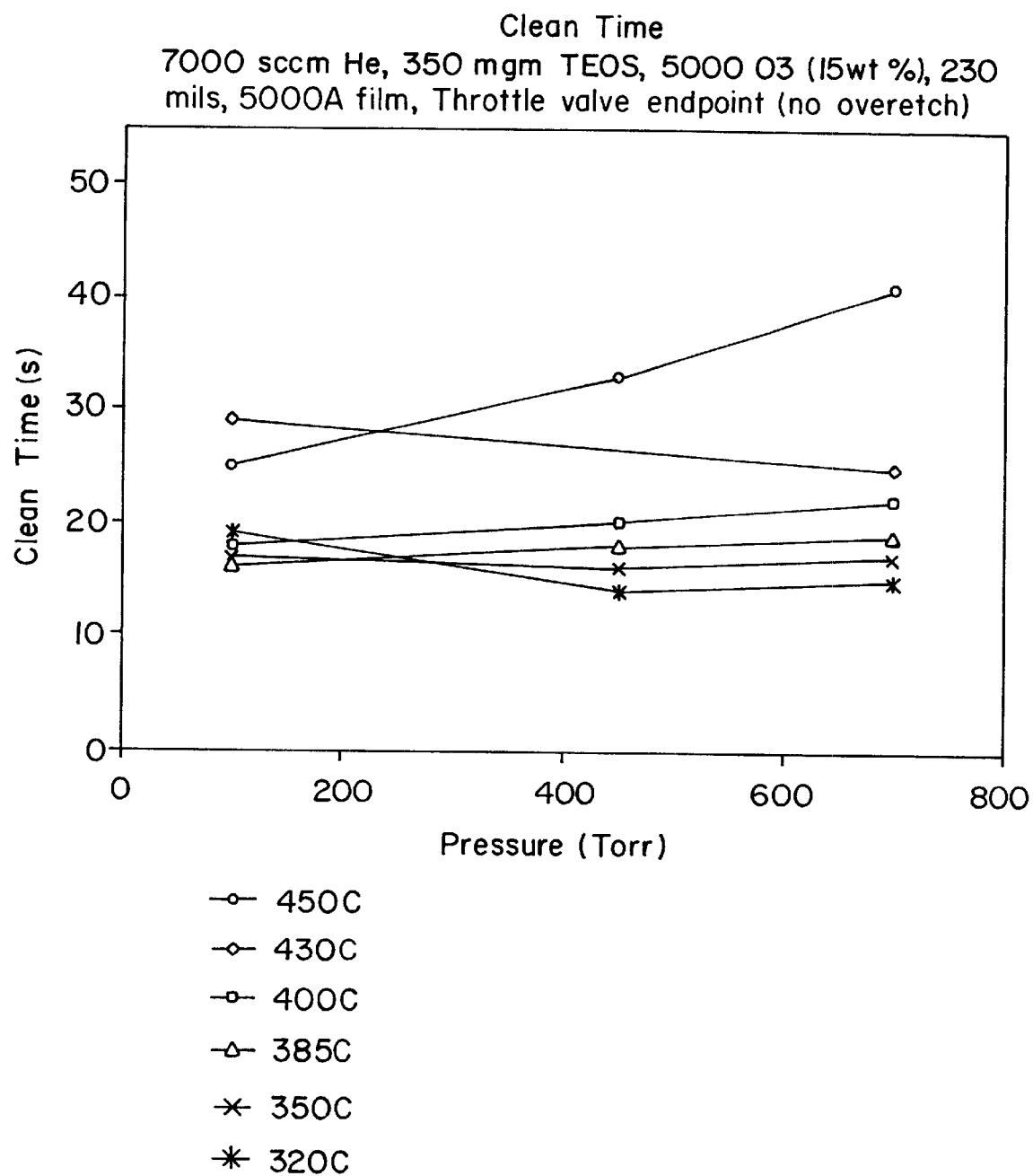

Additionally, the ozone/TEOS process possesses several advantages with reference to process integration. For example, a tunable selectivity/deposition rate results in more global self-planarization (FIGS. 9A and 9B), the shrinkage of the ozone/TEOS/oxide after annealing is minimal (FIG. 9D), and a void-free gap fill is achieved for very small gaps (<0.1 micron trench opening). Pretreatment enables increased deposition rate with lower temperatures. As the SELOX process does not require as many post deposition process steps as other shallow trench isolation procedures, the complexity and overall cost are reduced and wafer throughput is increased.

Table 1 summarizes the results of $O_3$/TEOS deposition of oxide film on a wafer under process conditions of variable temperature, pressure and $O_3$/TEOS ratios. Optimal conditions are 430C, 700 torr and 17 wt % $O_3$ which yield a good film quality below the nitride level. Table 2 summarizes the results using optimal conditions of silicon dioxide deposition using conformal deposition techniques, the standard shallow trench SELOX process and the new shallow trench SELOX process employing pretreatment of wafers. The new SELOX process shows good film quality next to the nitride layer at a deposition rate of 1400 Å/min.

TABLE 1

|  | 400C 700 T 18% O3 | 410C 700 T 18% O3 | 400C 500 T 18% O3 | 410C 500 T 17% O3 | 400C 700 T 425 TEOS | 410 C 700 T 17% O3 PRE | 370C 700 T 225 TEOS |
|---|---|---|---|---|---|---|---|
| Dep Rate Å/min | 1400 | 1230 | 1640 | 1500 | 1700 | 1200 | 1430 |
| Uniformity 49 pt | 4.0% | 4.5% | 3.0% | 3.3% | 3.1% | 4.2% | 2% |
| Selectivity | 4:1 | 2.7:1 | 3:1 | 2.7:1 | 2.8:1 | 2.7:1 | 3:1 |
| WERR (as dep) |  | 4.0 | 3.8 | 4.2 | 4.1 |  |  |
| Shrinkage N2/1000C | 4% | 3.7% | 5% |  |  |  |  |
| Shrinkage O2/1050C | 1% | 1% | 1% | 1% | 1% | 1% | 1% |
| Film quality below nitride level | some gaps have holes at nitride | very few pinholes at nitride | large voids at large gaps | GOOD small hole above nitride | voids | voids at nitride | porous |

TABLE 2

| | PRETREATMENT | | |
|---|---|---|---|
| | DxZ ILD 385 C., 450 Torr 12.5 wt % O3 | ST SELOX 430 C., 700 Torr 17 wt % O3 | +SELOX 400 C., 700 Torr 17 wt % O3 |
| Deposition Rate | 2029 Å/min | 1400 Å/min | 1400 Å/min |
| Uniformity 49 pt. sigma | 1.92% | 4.8% | 3.3% |
| Selectivity Si:Nitride | 1.3 | 2.6 | >5 |
| WERR (as dep) | 4,8 | 3,6 | |
| WERR post anneal | 1.4 | 1.4 | |
| Shrinkage N2, 1000 C. | 5 | 3 | |
| Shrinkage O2, 1050 C. | 1 | 1 | |
| Film quality below nitride | poor and porous | good no voids | good no voids |

The following references are used herein:

M. Yoshimaru and T. Yoshie. Effects of substrate on the growth characteristics of silicon oxide films deposited by atmospheric chemical vapor deposition using $Si(OC_2H_5)_4$ and $O_3$, J. Electrochem. Soc. 145, 2847 (1998).

K. Kwok, E. Yieh, S. Robles, and B.C. Nhuyen. Surface related phenomena in integrated PECVD/Ozone-TEOS SACVD processes for sub-half micron gap fill: Electrostatic effects, J. Electrochem. Soc. 141, 2172 (1994).

T. Homma, M. Suzuki, and Y. Murao. A fully planarized multilevel interconnection technology using semi-selective tetraethoxysilane-ozone chemical vapor deposition at atmospheric pressure, J. Electrochem. Soc. 140, 3591 (1993).

K. Tsukamoto, D. Cheng, H. Komiyama, Y. Nishimoto, N. Tokumasu, and K. Maeda. Tetraethylorthsilicate vapor treatment for eliminating surface sensitivity in tetraethylorthosilicate/O3 atmospheric-pressure chemical vapor deposition, Electrochem. Sol. St. Lett. 2, 24 (1999).

T. Nakano, N. Sato, and T. Ohta. A model of effects of surface pretreatment by organic solvents on ozone-tetraethoxysilane chemical vapor deposition, J. Electrochem. Soc. 142 641 (1995).

J. Schlueter. Trench Warfare: CMP and Shallow Trench Isolation, Semiconductor International, pg. 123–130 (Oct. 1999).

N. Elbe., Z. Gabric, W. Langheinrich, and B. Nerueither. A new STI Process Based on Selective Oxide Deposition, Symposium on VLSI Technology Digest of Technical Papers, pg. 208–209 (1998).

Any patents or publications mentioned in this specification are indicative of the levels of those skilled in the art to which the invention pertains. These patents and publications are herein incorporated by reference to the same extent as if each individual publication was specifically and individually indicated to be incorporated by reference.

One skilled in the art will readily appreciate that the present invention is well adapted to carry out the objects and obtain the ends and advantages mentioned, as well as those inherent therein. It will be apparent to those skilled in the art that various modifications and variations can be made in practicing the present invention without departing from the spirit or scope of the invention. Changes therein and other uses will occur to those skilled in the art which are encompassed within the spirit of the invention as defined by the scope of the claims.

What is claimed is:

1. A method of forming a silicon oxide film over a substrate having a plurality of raised features and a plurality of trenches formed between said raised features, wherein said plurality of raised features include an upper silicon nitride surface and said plurality of trenches include a lower silicon oxide surface, said method comprising:

vapor-depositing said silicon oxide film over said silicon nitride and silicon oxide surfaces of said substrate; and prior to said vapor-positing step, pretreating said substrate to decrease a deposition rate of said silicon oxide film over said silicon nitride region.

2. The method of claim 1 wherein a deposition rate of said silicon oxide film over said silicon oxide surface relative to a deposition rate of said silicon oxide film over said silicon nitride surface remains constant with a change in film thickness.

3. The method of claim 1 wherein said trenches are part of a shallow trench isolation structure.

4. The method of claim 1 wherein said silicon oxide film is vapor-deposited from a process gas comprising $O_3$ and TEOS.

5. The method of claim 4 wherein said silicon oxide film is deposited using a selective oxidation sub-atmospheric chemical vapor deposition (SELOX SACVD) process.

6. The method of claim 1 wherein said pretreating step comprises:

contacting said wafer with a chemical compound selected from the group consisting of hydrogen peroxide, isopropyl alcohol and acetone; and air-drying said chemical compound on said wafer.

7. The method of claim 6 wherein chemical compound consists of hydrogen peroxide diluted in water.

8. The method of claim 1 wherein said vapor-depositing step results in a self-planarized silicon oxide layer.

9. The method of claim 1 wherein said pretreating step comprises contacting said substrate with a chemical compound comprising hydrogen peroxide, alcohol or acetone.

10. A method of forming a silicon oxide film over a substrate having a plurality of raised features and a plurality of trenches formed between said raised features, wherein said plurality of raised features include an upper silicon nitride surface and said plurality of trenches include a lower silicon oxide surface, said method comprising:

vapor-depositing said silicon oxide film over said silicon nitride and silicon oxide surfaces of said substrate; and prior to said vapor-depositing step pretreating said substrate with a chemical compound consisting essentially of hydrogen peroxide, alcohol or acetone.

11. The method of claim 10 wherein a deposition rate of said silicon oxide film over said silicon oxide surface relative to a deposition rate of said silicon oxide film over said silicon nitride surface remains constant with a change in film thickness.

12. The method of claim 10 wherein said trenches are part of a shallow trench isolation structure.

13. The method of claim 10 wherein said silicon oxide film is vapor-deposited from a process gas comprising $O_3$ and TEOS.

14. The method of claim 10 wherein chemical compound consists of hydrogen peroxide diluted in water.

15. The method of claim 10 wherein said silicon oxide layer is deposited from a process gas comprising $O_3$ and TEOS.

16. The method of claim 15 wherein said silicon oxide film is deposited using a selective oxidation sub-atmospheric chemical vapor deposition (SELOX SACVD) process.

17. The method of claim 10 wherein said silicon oxide layer is deposited at a temperature of about 400° C.

18. The method of claim 10 further comprising, after pretreating said substrate and prior to said vapor-depositing step, drying said chemical compound on said wafer.

19. The method of claim 10 wherein said vapor-depositing step results in a self-planarized silicon oxide layer.

20. A method of forming a shallow trench isolation structure over a silicon substrate having a plurality of trenches etched therein, said plurality of trenches defining a plurality of raised regions therebetween, said method comprising:

forming a silicon oxide layer over said substrate and within said trenches;

forming a silicon nitride layer over said plurality of raised regions between said trenches;

pretreating said substrate with a chemical compound consisting essentially of hydrogen peroxide, alcohol or acetone; and vapor-depositing a silicon oxide film over said substrate.

21. The method of claim 20 wherein said chemical compound consists of hydrogen peroxide diluted in water.

22. Tile method of claim 21 wherein a deposition rate of said silicon oxide film over said silicon oxide surface relative to a deposition rate of said silicon oxide film over said silicon nitride surface remains constant with a change in film thickness.

23. Tile method of claim 21 wherein said silicon oxide layer is deposited at a temperature of 400° C.

24. The method of claim 21 further comprising, after pretreating said substrate and prior to said vapor-depositing step, air-drying said chemical compound on said wafer.

25. The method of claim 21 wherein said vapor-depositing step results in a self-planarized silicon oxide layer.

26. The method of claim 21 wherein said vapor-deposited silicon oxide layer is deposited from a process gas comprising $O_3$ and TEOS.

27. The method of claim 26 wherein said vapor-deposited silicon oxide layer is deposited using an SACVD process.

* * * * *